United States Patent
Song et al.

(10) Patent No.: US 7,995,157 B2
(45) Date of Patent: Aug. 9, 2011

(54) ARRAY SUBSTRATE FOR LIQUID CRYSTAL DISPLAY DEVICE AND METHOD OF FABRICATING THE SAME

(75) Inventors: Moo-Hyoung Song, Daegu (KR); Sung-Jin Hong, Seoul (KR)

(73) Assignee: LG Display Co., Ltd., Seoul (KR)

( * ) Notice: Subject to any disclaimer, the term of this patent is extended or adjusted under 35 U.S.C. 154(b) by 939 days.

(21) Appl. No.: 11/641,702

(22) Filed: Dec. 20, 2006

(65) Prior Publication Data

US 2007/0268422 A1 Nov. 22, 2007

(30) Foreign Application Priority Data

May 18, 2006 (KR) .................. 10-2006-0044525

(51) Int. Cl.
*G02F 1/1333* (2006.01)
*G02F 1/1343* (2006.01)
(52) U.S. Cl. .................................. 349/54; 349/139
(58) Field of Classification Search .................. 349/139, 349/54; 257/59
See application file for complete search history.

(56) References Cited

U.S. PATENT DOCUMENTS

| 5,652,633 A * | 7/1997 | Lee .................................. 349/42 |
| 5,877,827 A | 3/1999 | Lee |
| 2001/0013910 A1 | 8/2001 | Ahn et al. |
| 2003/0077973 A1 | 4/2003 | Wu |
| 2006/0077313 A1 * | 4/2006 | Liu et al. .......................... 349/55 |

FOREIGN PATENT DOCUMENTS

| JP | 4-182629 A | 6/1992 |
| JP | 8-62626 A | 3/1996 |
| JP | 8-330592 A | 12/1996 |
| JP | 09005786 A * | 1/1997 |

* cited by examiner

*Primary Examiner* — Wen-Ying P Chen
(74) *Attorney, Agent, or Firm* — Birch, Stewart, Kolasch & Birch, LLP

(57) ABSTRACT

An array substrate for a liquid crystal display device, includes: a gate line and a data line on a substrate, the data line crossing the gate line to define a pixel region; an insulating layer between the gate line and the data line; a switching element adjacent to a crossing of the gate line and the data line; a pixel electrode connected to the switching element, the pixel electrode disposed in the pixel region; and a first buffer pattern at a first side of one of the gate line and the date line and overlapped with the other one of the gate line and the date line, the first buffer pattern being disposed at the same layer as the one of the gate line and the date line.

10 Claims, 11 Drawing Sheets

ARRAY SUBSTRATE FOR LIQUID CRYSTAL DISPLAY DEVICE AND METHOD OF FABRICATING THE SAME

This Nonprovisional Application claims priority under 35 U.S.C. §119(a) on Patent Application No. 10-2006-0044525 filed in Korea on May 18, 2006, the entire contents of which are hereby incorporated by reference.

BACKGROUND OF THE INVENTION

1. Field of the Invention

The present invention relates to a liquid crystal display (LCD) device, and more particularly to an array substrate of an LCD device and a method of fabricating the same that can prevent disconnection of a top metal line due to a step difference in a bottom metal line under the top metal line and crossing the top metal line.

2. Discussion of the Related Art

Generally, LCD devices include first and second electrode bearing substrates coupled to, and spaced apart from each other by a layer of liquid crystal material. LCD devices exploit anisotropic optical properties of the liquid crystal material and display images. In particular, electric fields generated when a voltage is applied to the electrodes on the substrates can selectively manipulate the light transmittance characteristics of the liquid crystal material.

FIG. 1 is a schematic cross-sectional view of an LCD device according to the related art.

In FIG. 1, an LCD device 11 includes upper and lower substrate 5 and 22 facing and spaced apart from each other and a liquid crystal layer 14 between the upper and lower substrates 5 and 22. Here, the upper and lower substrates 5 and 22 include pixel regions "P." Specifically, the pixel region "P" of the upper substrate 5 and the pixel region "P" of the lower substrate 22 correspond to each other.

A color filter layer 7 including red (R), green (G) and blue (B) sub-color filters 7a, 7b and 7c is formed on an inner surface of the upper substrate 5. A black matrix 6 is formed on the color filter layer 7. Here, each of the red (R), green (G) and blue (B) sub-color filters 7a, 7b and 7c is disposed in the pixel region "P," and the black matrix 6 is disposed between the sub-color filters 7a, 7b and 7c in a non-pixel region (not shown). Further, a common electrode 18 is formed on the black matrix 6 and the color filter layer 7.

A gate line 12 is formed on an inner surface of the lower substrate 22. A data line 24 is formed over the gate line 12 and crosses the gate line 12 to define the pixel region "P." A thin film transistor "T" is connected to the gate line 12 and the data line 24. The thin film transistor "T" is adjacent to the crossing of the gate line 12 and the data line 24. In addition, the thin film transistor "T" includes a gate electrode 30, a semiconductor layer 32, and source and drain electrodes 34 and 36. Further, a pixel electrode 17 is connected to the thin film transistor "T" in the pixel region "P."

Specifically, the liquid crystal layer 14 is interposed between the common electrode 18 and the pixel electrode 17. Here, the liquid crystal layer 14 is pre-aligned by alignment layers (not shown) between the common electrode 18 and the liquid crystal layer 14 and between the pixel electrode 17 and the liquid crystal layer 14. In addition, the alignment layers are rubbed to help the pre-alignment of the liquid crystal layer 14.

Meanwhile, when voltages are applied to the pixel electrode 17 and the common electrode 18, a vertical electric field between the pixel electrode 17 and the common electrode 18 is generated. Therefore, an image can be displayed by varying the transmittance of light in accordance with the vertical electric field.

During the manufacturing process, there are more defects in the process of forming the array substrate which includes the lower substrate 22, the gate line 12, the data line 24, the thin film transistor "T," and the pixel electrode 17 than in the process of forming the color filter substrate which includes the upper substrate 5, the color filter layer 7, the black matrix 6 and the common electrode 18.

This is because more photolithography processes are performed to form the array substrate. Accordingly, the number of defects of the array substrate is much higher than that of the color filter substrate. Particularly, a top metal line, such as the data line 24, may be easily disconnected at the crossing of a bottom metal line, such as the gate line 12, and the top metal line due to a step difference in the bottom metal line.

FIG. 2 is a schematic plan view of an array substrate with respect to one pixel region according to the related art.

In FIG. 2, an array substrate "AS" includes a gate line 52 and a data line 62 crossing each other to define a pixel region "P," a thin film transistor "T" adjacent to the crossing of the gate and data lines 52 and 62, and a pixel electrode 64 connected to the thin film transistor "T" in the pixel region "P."

Here, the gate line 52 and the data line 62 have a crossing portion "III." In this crossing portion "III," the data line 62 over the gate line 52 is frequently disconnected due to the step difference in the gate line 52.

Hereinafter, the disconnection defect at the crossing portion "III" of the gate and data lines 52 and 62 will be explained as follows.

FIG. 3 is an expanded plan view of "III" of FIG. 2. FIG. 4 is a schematic cross-sectional view taken along a line of "IV-IV" of FIG. 3.

In FIGS. 3 and 4, the gate line 52 and the data line 62 cross each other with a gate insulating layer (not shown) therebetween.

Generally, because the gate line 52 has a thickness of about 2,000~3,000 angstrom (Å), the data line 62 disposed over the gate line 52 has a side step difference in the gate line 52 having the above-noted thickness. More particularly, because the gate insulating layer (not shown) is generally made of a silicon nitride (SiNx) or silicon oxide (SiOx) and has a thickness of about 3,000~4,000 angstrom (Å), the gate insulating layer cannot offset the step difference in the gate line 52. Therefore, at the crossing portion "III" of the gate line 52 and the data line 62, the data line 62 is formed along the step difference in the gate line 52.

Consequently, because the data line 62 is formed along the side step difference portion "SP" in the gate line 52, the data line 62 is easily disconnected at the side step difference portion "SP" due to the deposition defect or the like. Further, an etchant for etching the data line 62 may pool in a concave portion at the side step difference portion "SP." Therefore, in the concave portion, the data line 62 may be excessively etched. Accordingly, the data line 62 may be disconnected.

The disconnection defect reduces the productivity and increases the manufacturing cost.

SUMMARY OF THE INVENTION

Accordingly, the present invention is directed to an array substrate for an LCD device and a method of fabricating the same that substantially obviates one or more of the problems due to limitations and disadvantages of the related art.

An advantage of the present invention provides an array substrate for an LCD device and a method of fabricating the same that can prevent the disconnection defect of metal lines crossing each other.

Another advantage of the present invention provides an array substrate for an LCD device and a method of fabricating the same that can improve productivity and reduce the manufacturing cost.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an array substrate for a liquid crystal display device, includes: a gate line and a data line on a substrate, the data line crossing the gate line to define a pixel region; an insulating layer between the gate line and the data line; a switching element adjacent to a crossing of the gate line and the data line; a pixel electrode connected to the switching element, the pixel electrode disposed in the pixel region; and a first buffer pattern at a first side of one of the gate line and the date line and overlapped with the other one of the gate line and the date line, the first buffer pattern being disposed at the same layer as the one of the gate line and the date line.

In one aspect of the present invention, a method of fabricating an array substrate for a liquid crystal display device, as embodied, includes: forming one of a gate line and a date line, and a first buffer pattern on a substrate, the first buffer pattern being formed at a first side of the one of the gate line and the date line; forming an insulating layer on the one of the gate line and the date line, and the first buffer pattern; forming the other one of the gate line and the date line on the insulating layer, the other one of the gate line and the date line crossing the one of the gate line and the date line to define a pixel region, the other one of the gate line and the date line being overlapped with the first buffer pattern; forming a switching element connected to the gate line and the data line adjacent to a crossing of the gate line and the data line; and forming a pixel electrode connected to the switching element, the pixel electrode being disposed in the pixel region.

In another aspect of the present invention, a crossing line structure of a display device, as embodied, comprises: a first line on a substrate; an insulating layer on the first line; a second line on the insulating layer, the second line crossing the first line; and a first buffer pattern at a first side of the first line and overlapped with the second line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, example of which is illustrated in the accompanying drawings. Wherever possible, similar reference numbers will be used throughout the drawings to refer to the same or like parts.

Hereinafter, exemplary embodiments according to the present invention will be explained as follows.

Figure 1:
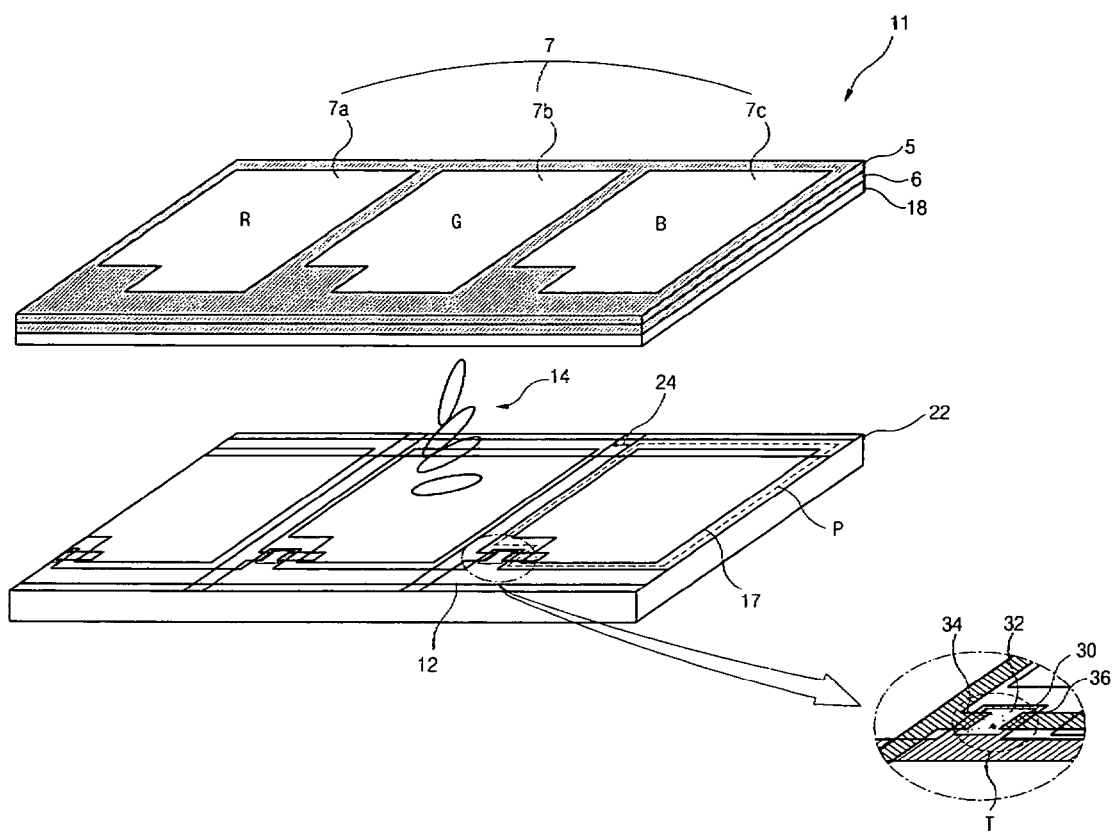
FIG. 1 is a schematic cross-sectional view of an LCD device according to the related art.
Figure 2:
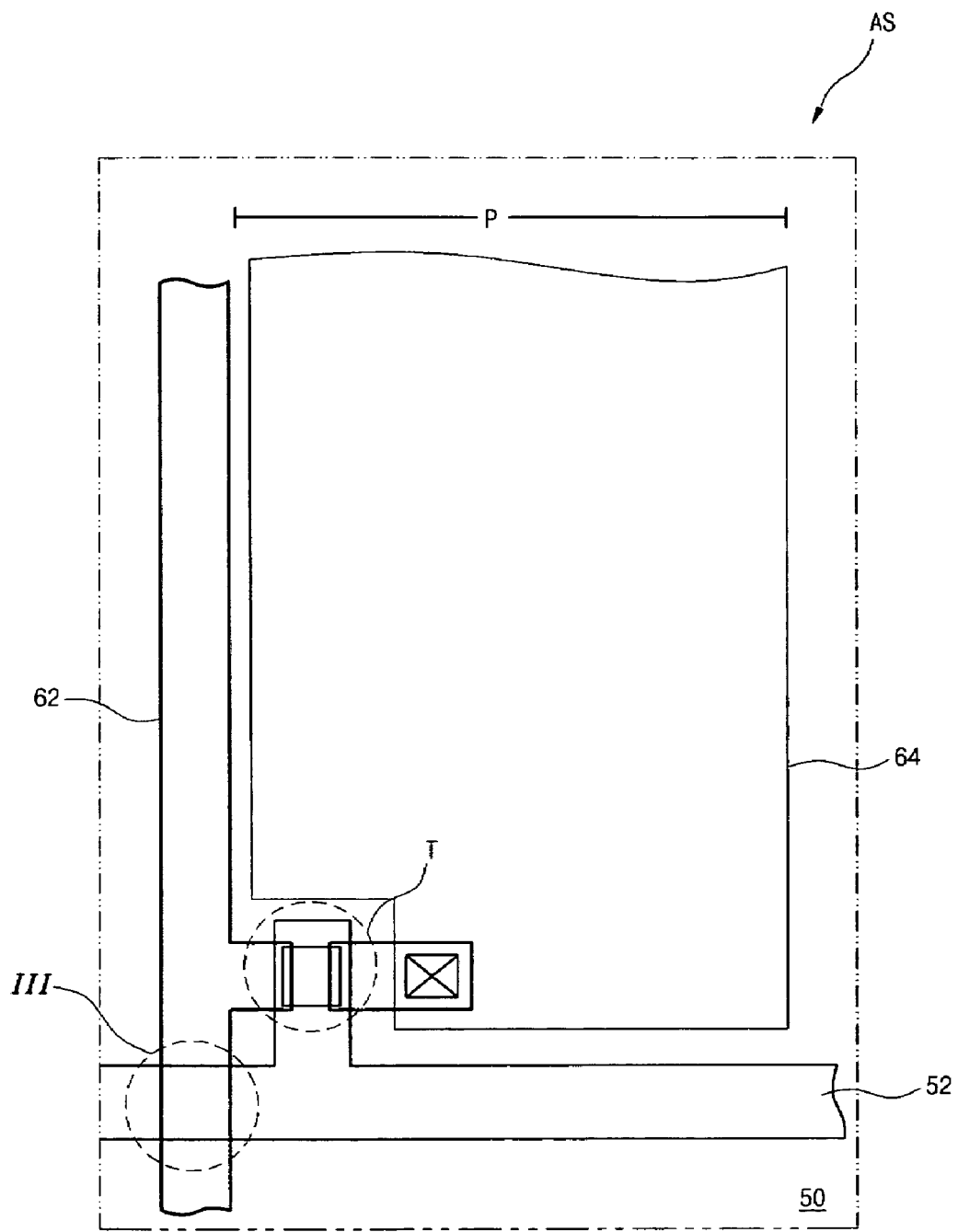
FIG. 2 is a schematic plan view of an array substrate with respect to one pixel region according to the related art.
Figure 3:
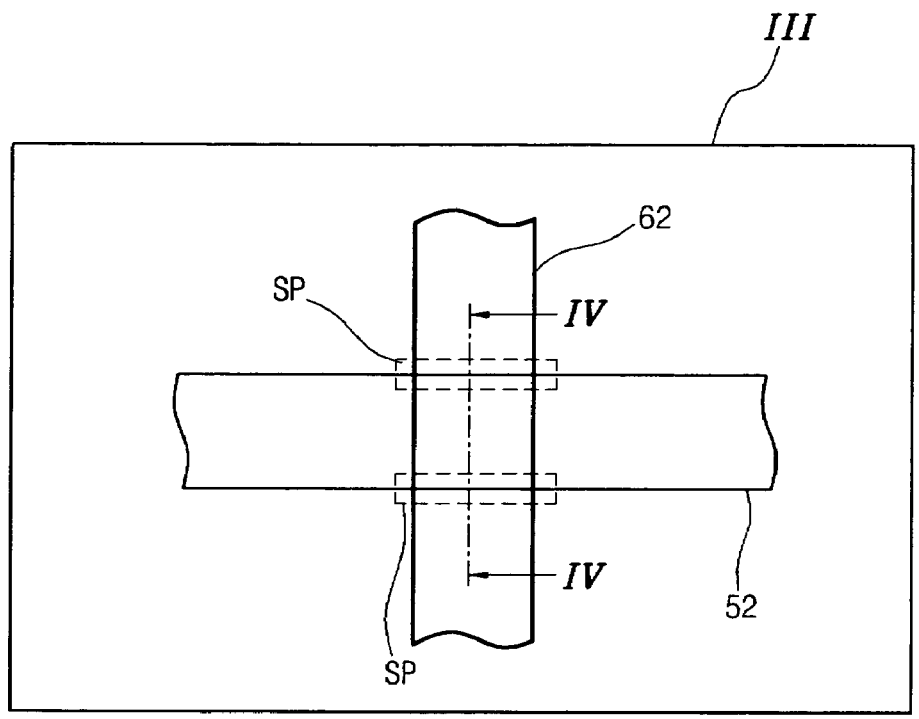
FIG. 3 is an expanded plan view of "III" of FIG. 2.
Figure 4:
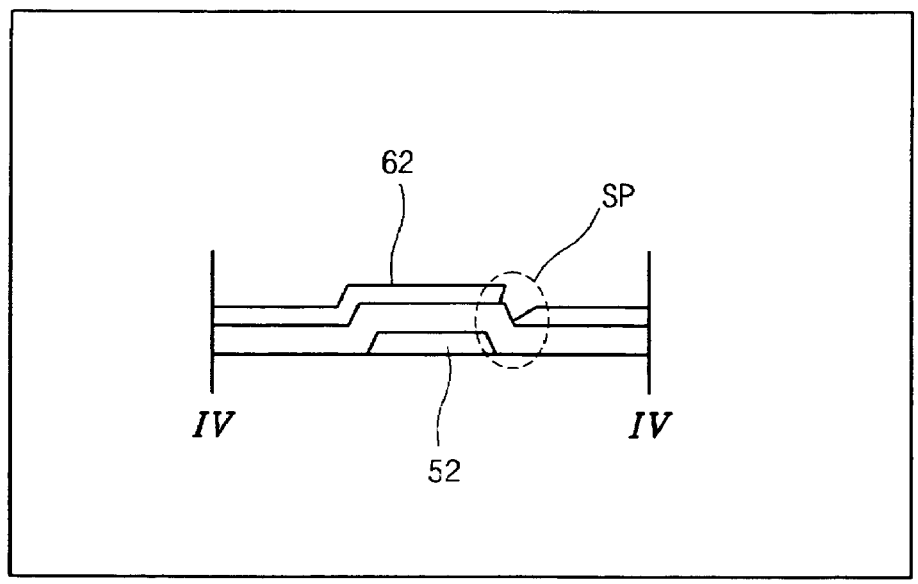
FIG. 4 is a schematic cross-sectional view taken along a line of "IV-IV" in FIG. 3.
Figure 5:
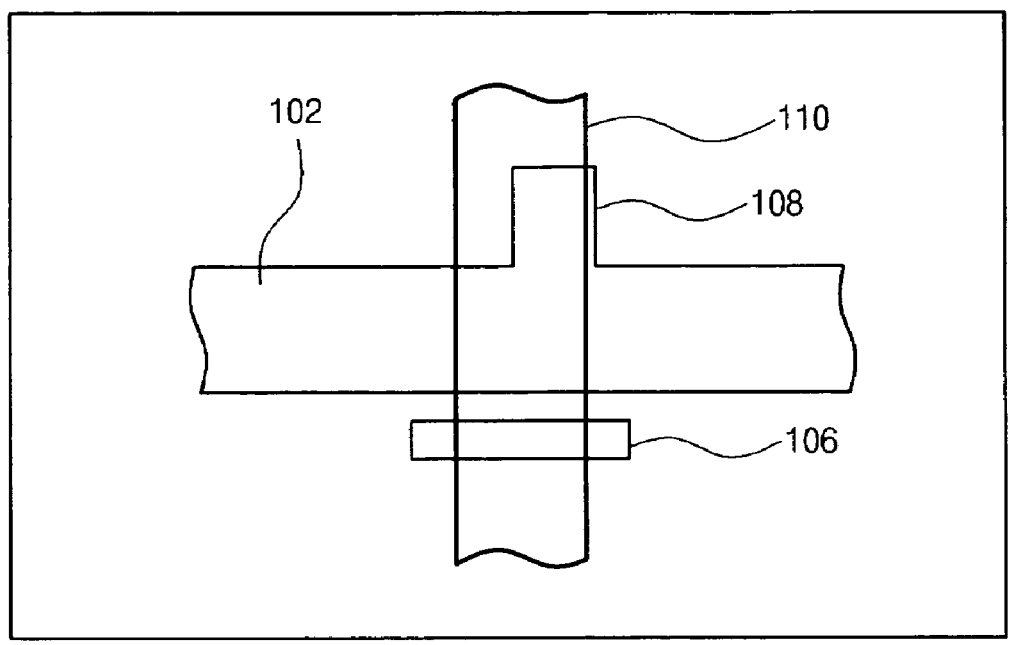
FIG. 5 is a schematic plan view of a crossing portion of two metal lines of an array substrate including buffer patterns according to a first embodiment of the present invention.
Figure 6:
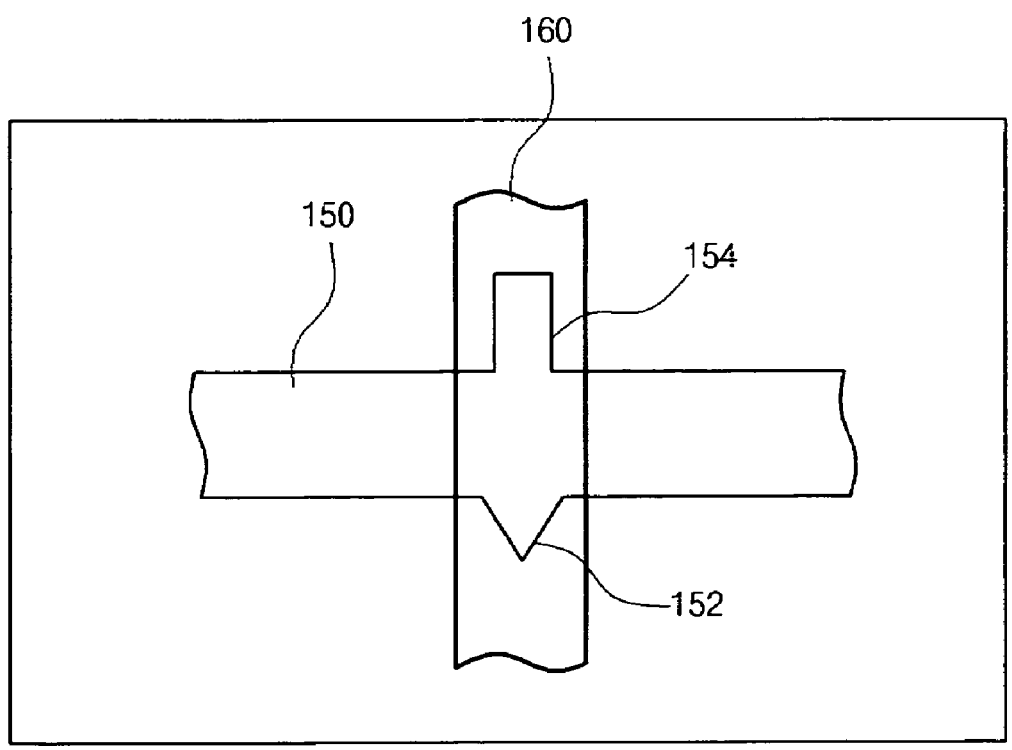
FIG. 6 is a schematic plan view of a crossing portion of two metal lines of an array substrate including buffer patterns according to a second embodiment of the present invention.

FIG. 5 is a schematic plan view of a crossing portion of two metal lines of an array substrate including buffer patterns according to a first embodiment of the present invention. FIG. 6 is a schematic plan view of a crossing portion of two metal lines of an array substrate including buffer patterns according to a second embodiment of the present invention.

In FIG. 5, a first metal line 102 is formed along a first direction and a second metal line 110 is formed along a second direction crossing the first direction. Although not shown, an insulating layer is disposed between the first metal line 102 and the second metal line 110. Further, first and second buffer patterns 106 and 108 are formed at the same layer as the first metal line 102. Here, the first buffer pattern 106 has a bar shape spaced apart from the first metal line 102 and along the first direction. The second buffer pattern 108 extends from the first metal line 102. For example, the second buffer pattern 108 has a square pattern as shown in FIG. 5. Specifically, the size of the second buffer pattern 108 is selected from a range so that the main portion of the second buffer pattern 108 could be covered by the second metal line 110.

Alternatively, in FIG. 6, first and second buffer patterns 152 and 154 extend from a first metal line 150 along the second direction so as to be overlapped with the second metal line 160. For example, the first buffer pattern 152 may have a triangular shape and the second buffer pattern 154 may have a square shape. In FIG. 6, the first and second buffer patterns 152 and 154 are symmetrically disposed with respect to a central portion of the second metal line 160. However, in order to reduce the step difference of the first metal line 150, the first and second metal lines 150 and 160 may be disposed at the other positions within the range so that the second metal line 160 could cover the first and second buffer patterns 152 and 154. That is, each of the first and second buffer patterns 150 and 160 can be selected from various shapes to reduce the step difference in the first metal line 150. In addition, although two buffer patterns are used in the illustrated embodiments, any number of buffer patterns can be used to reduce the step difference. For example, a single buffer pattern can be used at one side of the second metal line 160, or more than two buffer patterns can be used at one side or two sides of the second metal line 160.

Anyway, what the buffer patterns according to the present invention are disposed at both sides of an upper metal line that overlapped with a lower metal line may be proper in order to obtain effects according to the present invention.

Further, what the etchant pools at the crossing of the first and second metal lines 150 and 160 is effectively prevented by the first and second buffer patterns 152 and 154.

Figure 7:
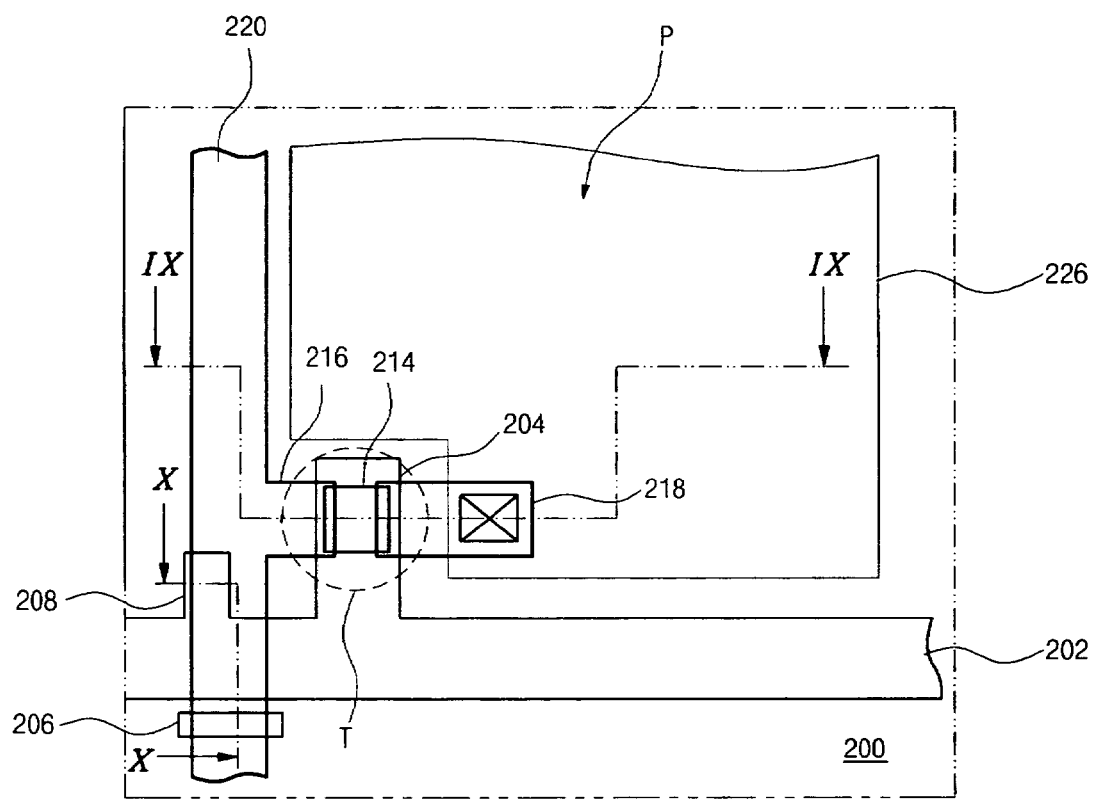
FIG. 7 is a schematic plan view of an array substrate for an LCD device including first and second buffer patterns with respect to one pixel region according to a first embodiment of the present invention.
Figure 8:
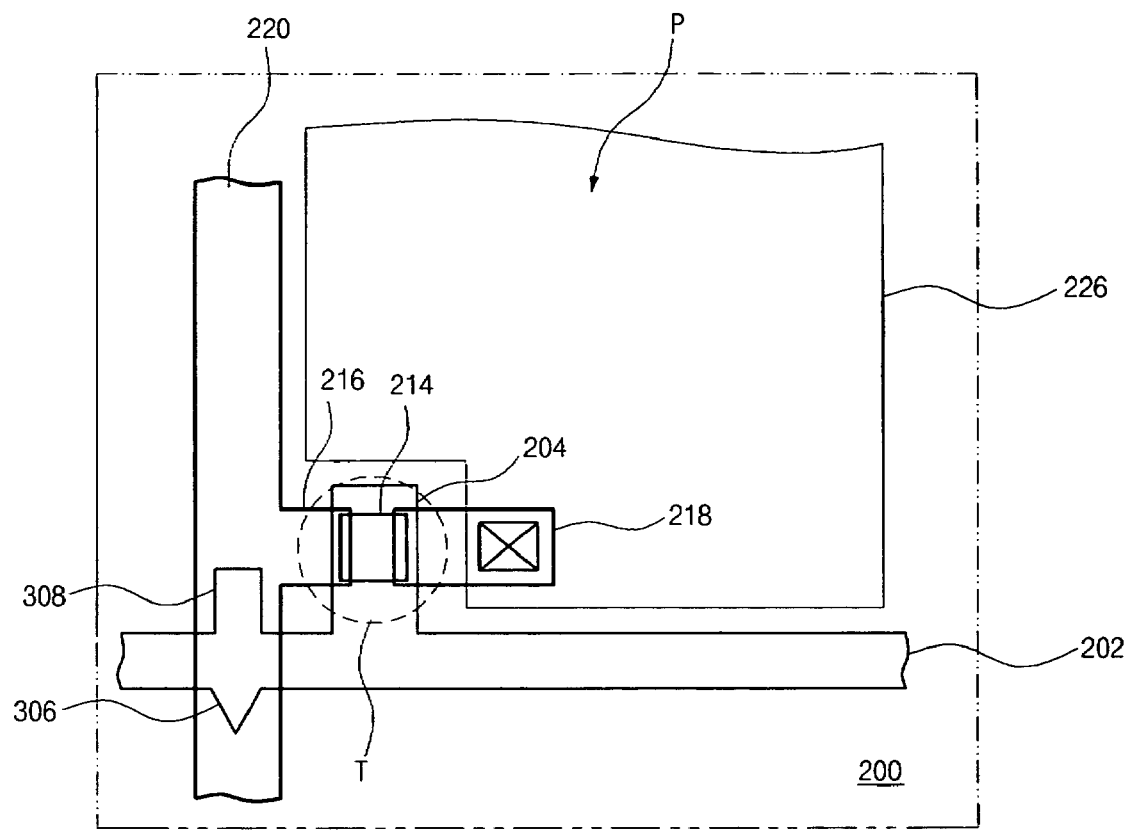
FIG. 8 is a schematic plan view of an array substrate for an LCD device including first and second buffer patterns with respect to one pixel region according to a second embodiment of the present invention.

FIG. 7 is a schematic plan view of an array substrate for an LCD device including first and second buffer patterns with respect to one pixel region according to a first embodiment of the present invention. FIG. 8 is a schematic plan view of an array substrate for an LCD device including first and second buffer patterns with respect to one pixel region according to a second embodiment of the present invention.

In FIGS. 7 and 8, a gate line 202 is formed along a first direction on a substrate 200. A data line 220 is formed along a second direction crossing the first direction to define a pixel region "P." Although not shown, a gate insulating layer is interposed between the gate and data lines 202 and 220. A thin film transistor "T," which includes a gate electrode 204, a semiconductor layer 214, a source electrode 216 and a drain electrode 218, is adjacent to the crossing of the gate and data lines 202 and 220. A pixel electrode 226 is connected to the thin film transistor "T" in the pixel region "P." Further, the first and second buffer patterns 206 and 208 (of FIG. 7) or 306 and 308 (of FIG. 8) are formed at the same layer as the gate line 202.

In FIG. 7, the first buffer pattern 206 has a bar shape spaced apart from the gate line 202 and along a direction parallel to the first direction. The second buffer pattern 208 extends from the gate line 202 along the second direction so that the main portion of the second buffer pattern 208 is overlapped with the data line 220.

Alternatively, in FIG. 8, the first and second buffer patterns 306 and 308 extend from the gate line 202. Here, each of the first and second buffer patterns 306 and 308 extends toward a direction opposite to each other. Specifically, the first buffer pattern 306 has a triangular shape and the second buffer pattern 308 has a square shape. However, the shapes of the first and second buffer patterns 306 and 308 may be changed into different types.

Hereinafter, a manufacturing process of an array substrate for an LCD device according to an embodiment of the present invention will be explained as follows.

FIGS. 9A, 9B, 9C and 9D are schematic cross-sectional views of an array substrate for an LCD device taken along a line of "IX-IX" in FIG. 7 in accordance with manufacturing steps according to an embodiments of the present invention. FIGS. 10A, 10B, 10C and 10D are schematic cross-sectional views of an array substrate for an LCD device taken along a line of "X-X" in FIG. 7 in accordance with manufacturing steps according to an embodiments of the present invention.

Figure 9A:
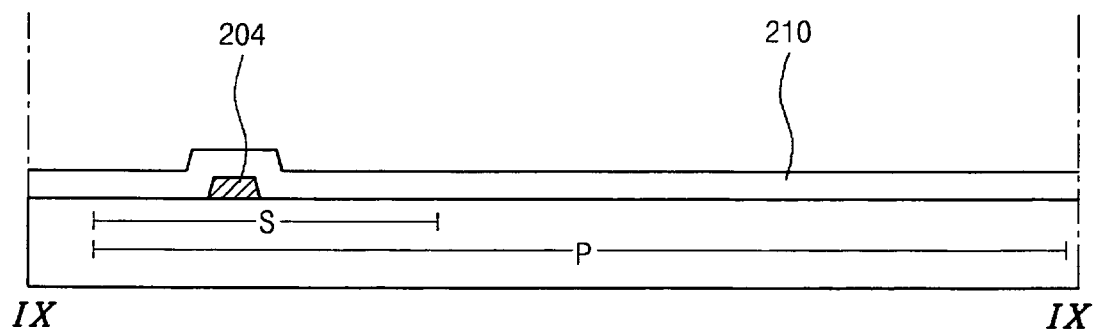
FIGS. 9A, 9B, 9C and 9D are schematic cross-sectional views of an array substrate for an LCD device taken along a line of "IX-IX" in FIG. 7 in accordance with manufacturing steps according to an embodiments of the present invention.
Figure 10A:
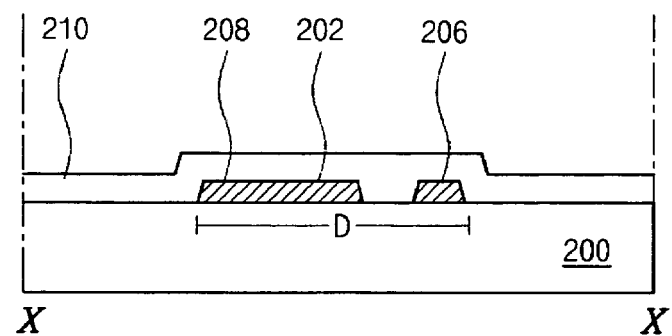
FIGS. 10A, 10B, 10C and 10D are schematic cross-sectional views of an array substrate for an LCD device taken along a line of "X-X" in FIG. 7 in accordance with manufacturing steps according to an embodiments of the present invention.

In FIGS. 9A and 10A, a substrate 200 includes a pixel region "P" and a switching region "S." A conductive metallic material is deposited the substrate 200 and is patterned to form a gate line 202 and a gate electrode 204. Although not shown, the gate line 202 is formed along a first direction and the gate electrode 204 is disposed in the switching region "S."

Further, a first buffer pattern 206 is formed to be spaced from the gate line 202, and a second buffer pattern 208 extends from the gate line 202. Although not shown, the first buffer pattern 206 has a bar shape parallel to the first direction, and the second buffer pattern 208 has a square shape in a plan view. Specifically, the first and second buffer patterns 206 and 208 are disposed in a crossing portion of the gate line 202 and a data line that will be formed later.

However, the first and second buffer patterns 206 and 208 may be changed into various shapes.

The conductive metallic material is selected from aluminum (Al), aluminum alloy such as aluminum neodymium (AlNd), chromium (Cr), tungsten (W), molybdenum (Mo) and titanium (Ti) and the like.

Next, a gate insulating layer is formed by depositing an inorganic insulating layer such as silicon nitride (SiNx) or silicon oxide (SiOx) on the gate line 202, the gate electrode 204, and the first and second buffer patterns 206 and 208.

Figure 9B:
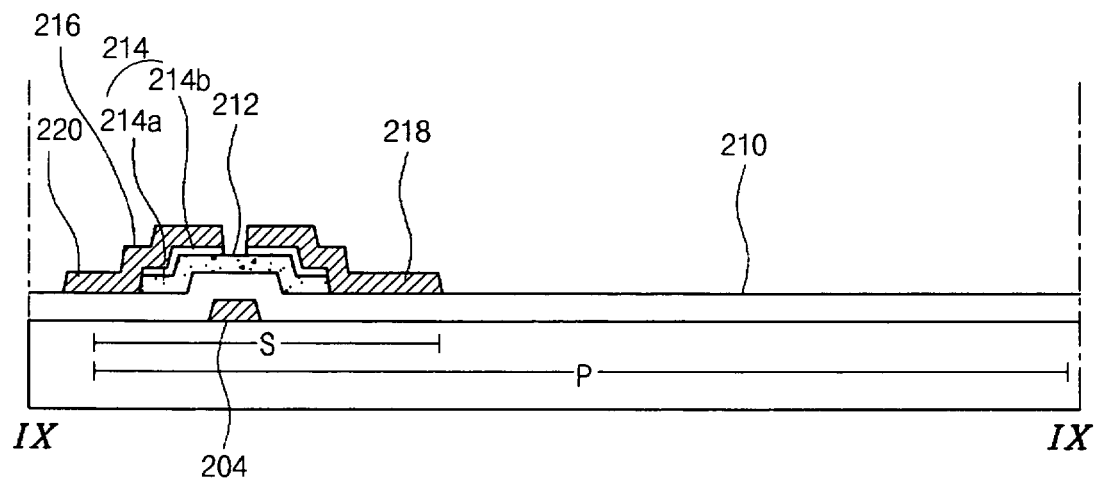
Figure 10B:
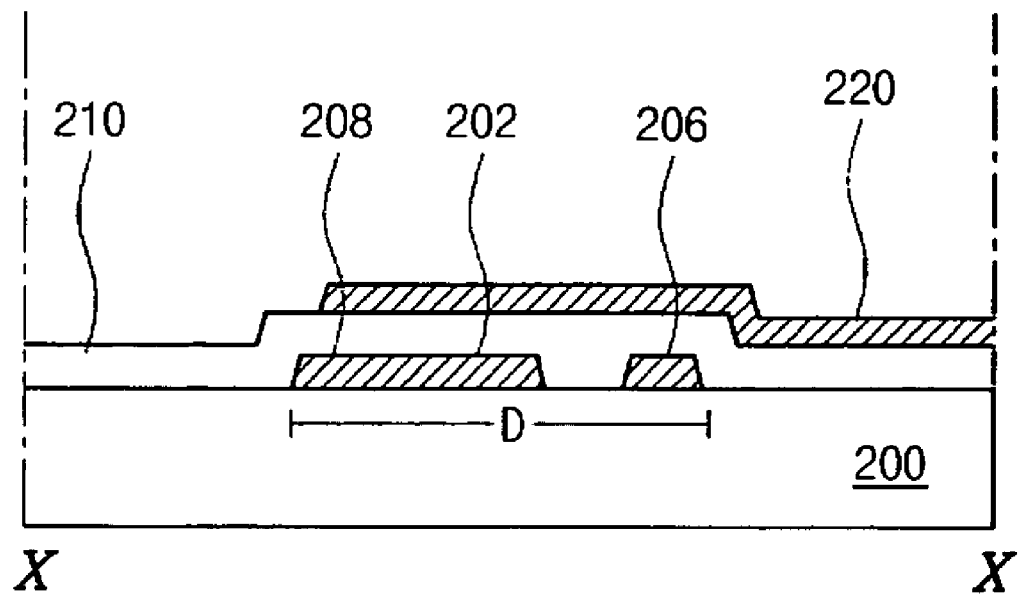

In FIGS. 9B and 10B, a semiconductor layer 214 is formed by sequentially depositing an intrinsic amorphous silicon (a-Si: H) and a doped amorphous silicon (n+a-Si:H) on the gate insulating layer. Specifically, the intrinsic amorphous silicon (a-Si:H) and the doped amorphous silicon (n+a-Si:H) are patterned into an active layer 214a and an ohmic contact layer 214b, respectively. That is, the semiconductor layer 214 includes the active layer 214a and the ohmic contact layer 214b.

Next, a data line 220, a source electrode 216 and a drain electrode 218 are formed by depositing and patterning a conductive metallic material such as the mentioned conductive metallic material on the semiconductor layer 214. Specifically, the data line 220 is formed along a second direction crossing the first direction, the source electrode 216 extends from the data line 220, and the drain electrode 218 is spaced apart from the source electrode 216. A portion of the active layer 214a is exposed between the source and drain electrode 216 and 218. The gate electrode 204, the semiconductor layer 214, the source electrode 216 and the drain electrode 218 constitute a thin film transistor "T."

It is noted that the data line 220 crosses the gate line 202 and covers the first and second buffer patterns 206 and 208. Therefore, the step difference in the gate line 202 can be reduced by the first and second buffer patterns 206 and 208. Accordingly, the disconnection defect from the data line 220 can be prevented.

Figure 9C:
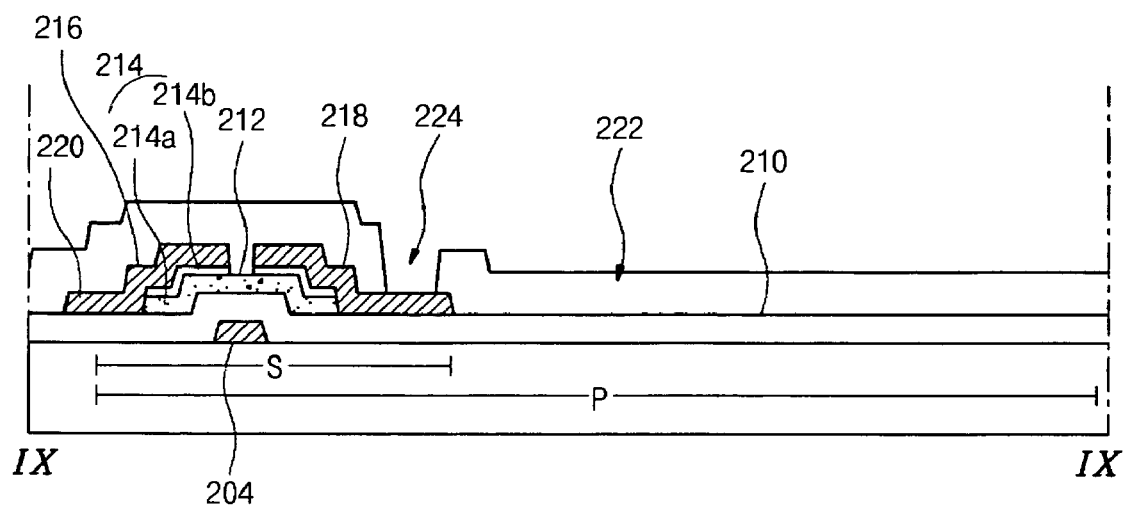
Figure 10C:
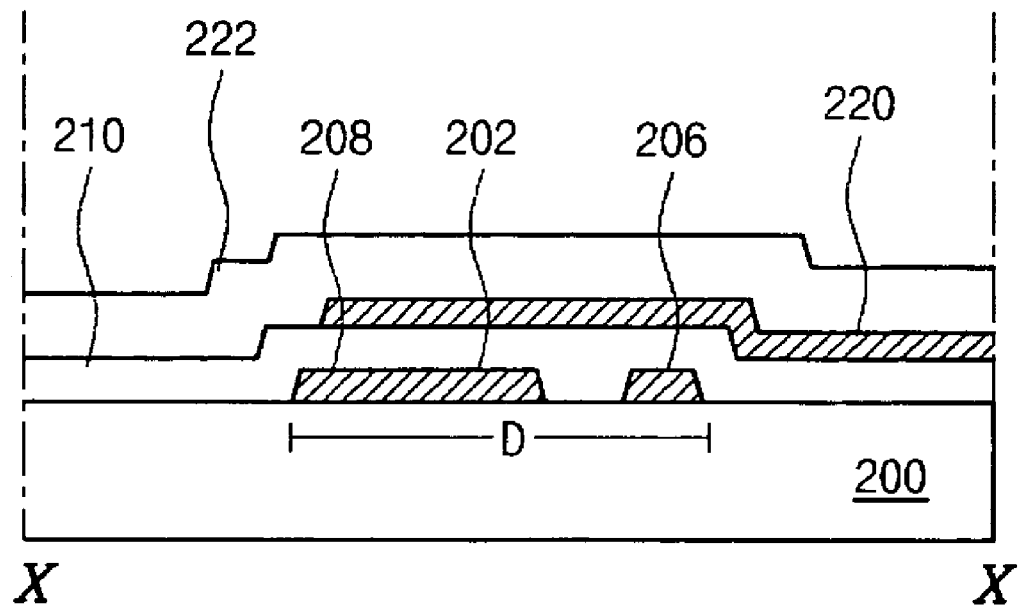

In FIGS. 9C and 10C, a passivation layer 222 is formed by depositing (or coating) and patterning an inorganic insulating material such as silicon nitride (SiNx) or silicon oxide (SiOx) or an organic insulating material such as benzocyclobutene (BCB) or acrylic resin on the thin film transistor "T." Here, the passivation layer 222 includes a drain contact hole 224 that exposes a portion of the drain electrode 218 through the patterning process.

Figure 9D:
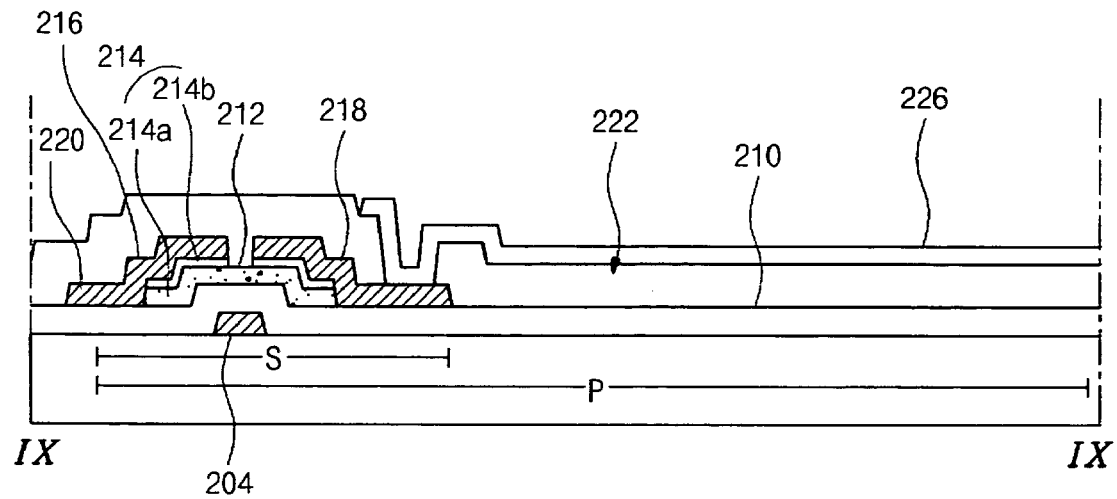
Figure 10D:
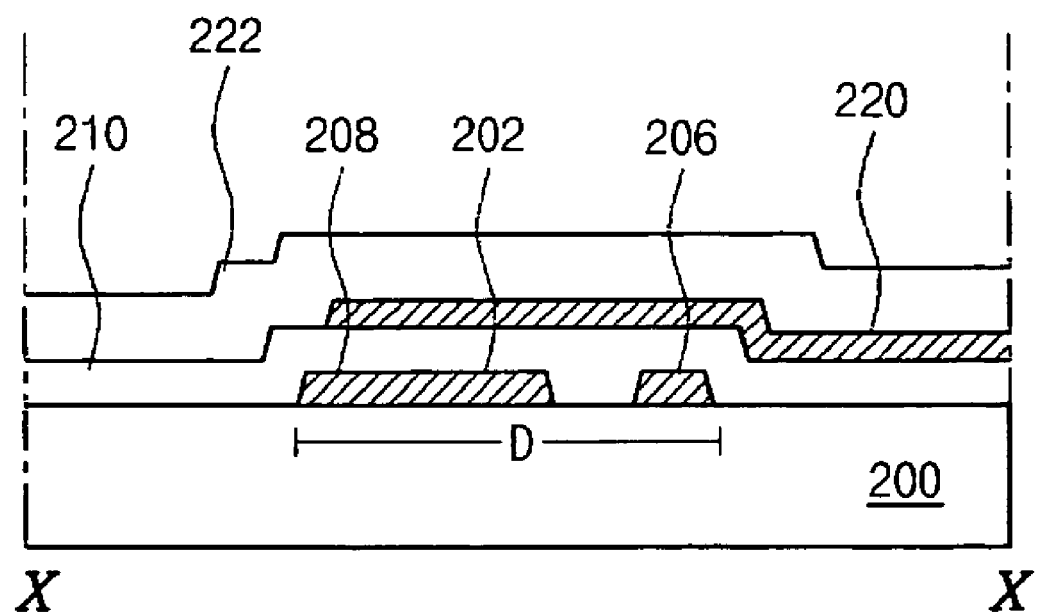

In FIGS. 9D and 10D, a pixel electrode 226 is formed by depositing and patterning a transparent conductive material such as indium tin oxide (ITO), indium zinc oxide (IZO) on the passivation layer 222 in the pixel region "P." Here, the pixel electrode 226 is connected to the drain electrode 218 via the drain contact hole 224.

The first and second buffer patterns 206 and 208 according to an embodiment of the present invention can prevent disconnection defect at the crossing of two metal lines such as gate and data lines 202 and 220, thereby improving productivity and reducing the manufacturing cost.

Although the above embodiments use a bottom-gate TFT structure as an example and apply the present invention to prevent the disconnection defect of the date line due to the step difference of the gate line, it should be noted that the present invention can also be applied to any crossing line structure. For example, the present invention can also be applied to a top-gate TFT structure to prevent the disconnection defect of the gate line due to the step difference of the date line, or any other crossing line structure to prevent the disconnection defect of the upper line due to the step difference of the lower line.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate for a liquid crystal display device, comprising:
    a gate line and a data line on a substrate, the data line crossing the gate line to define a pixel region;
    an insulating layer between the gate line and the data line;
    a switching element adjacent to a crossing of the gate line and the data line;
    a pixel electrode connected to the switching element, the pixel electrode disposed in the pixel region;
    a first buffer pattern at a first side of the gate line and overlapped with the date line, the first buffer pattern being disposed at the same layer as the gate line,
    wherein the first buffer pattern has a bar shape parallel to and is spaced apart from the gate line,
    wherein an overlapped portion between the first buffer pattern and the data line has bilateral symmetry, and wherein the first buffer pattern is spaced apart from the pixel electrode in a horizontal plane; and
    a second buffer pattern at a second side of the gate line opposite to the first side and overlapped with the data line,
    wherein the second buffer pattern extends from the gate line.

2. The array substrate according to claim 1, wherein the first and second buffer patterns are disposed at the same layer as the gate line.

3. The array substrate according to claim 1, wherein the second buffer pattern is closer than the first buffer pattern to the switching element.

4. The array substrate according to claim 1, wherein the second buffer pattern has one of a tetragonal shape and a triangular shape.

5. The array substrate according to claim 2, wherein the first and second buffer patterns and the gate line are substantially coplanar.

6. The array substrate according to claim 2, wherein the first and second buffer patterns and the gate line are made of substantially the same material.

7. A method of fabricating an array substrate for a liquid crystal display device, comprising:
    forming a gate line, a first buffer pattern and a second buffer pattern on a substrate, the first buffer pattern being formed at a first side of the gate line, and the second buffer pattern being formed at a second side of the gate line opposite to the first side,
    wherein the first buffer pattern has a bar shape parallel to and is spaced apart from the gate line and
    wherein the second buffer pattern extends from the gate line;
    forming an insulating layer on the gate line, the first buffer pattern and the second buffer pattern;
    forming a date line on the insulating layer, the date line crossing the gate line to define a pixel region, the date line being overlapped with the first buffer pattern and second buffer pattern,
    wherein an overlapped portion between the first buffer pattern and the data line has bilateral symmetry;
    forming a switching element connected to the gate line and the data line adjacent to a crossing of the gate line and the data line; and
    forming a pixel electrode connected to the switching element, the pixel electrode being disposed in the pixel region, wherein the first buffer pattern is spaced apart from the pixel electrode in a horizontal plane.

8. The method according to claim 7, wherein the steps of forming the gate line, the first buffer pattern and the second buffer pattern include forming the second buffer pattern to have one of a tetragonal shape and a triangular shape.

9. The method according to claim 7, wherein the steps of forming the gate line, the first buffer pattern and the second buffer pattern include forming the first and second buffer patterns and the gate line to be substantially coplanar.

10. The method according to claim 7, wherein the steps of forming the gate line, the first buffer pattern and the second buffer pattern include forming the first and second buffer patterns and the gate line of substantially the same material.

* * * * *